United States Patent
Chen

(10) Patent No.: US 6,867,595 B2
(45) Date of Patent: Mar. 15, 2005

(54) VERIFICATION SYSTEM FOR VERIFYING AUTHENTICITY OF A BATTERY AND METHOD THEREOF

(75) Inventor: Kuan-Hua Chen, Taipei (TW)

(73) Assignee: BenQ Corporation, Tao-Yuan Hsien (TW)

( * ) Notice: Subject to any disclaimer, the term of this patent is extended or adjusted under 35 U.S.C. 154(b) by 0 days.

(21) Appl. No.: 10/609,532

(22) Filed: Jul. 1, 2003

(65) Prior Publication Data

US 2005/0001629 A1 Jan. 6, 2005

(51) Int. Cl.$^7$ ............................................. G01N 27/416

(52) U.S. Cl. ....................... 324/433; 324/426; 324/609; 320/132; 320/162

(58) Field of Search ................................ 324/426, 609, 324/713, 158.1, 433; 320/106, 130, 132, 162

(56) References Cited

U.S. PATENT DOCUMENTS 6,215,274 B1 * 4/2001 Dotzler ........................ 320/106
6,605,922 B2 * 8/2003 Tamai et al. ................. 320/106

* cited by examiner

Primary Examiner—Vincent Q. Nguyen
(74) Attorney, Agent, or Firm—Winston Hsu

(57) ABSTRACT

A verification system for verifying authenticity of a battery used in a portable electronic device includes a battery for supplying a first electrical current, the battery containing a transducer for inducing an analog voltage based on the first electrical current, and a portable electronic device having the battery removably installed therein. The portable electronic device includes an analog-to-digital converter (ADC) electrically connected to the transducer for converting the analog voltage to a digital voltage value, a lookup table for providing an expected voltage value based on an operating state of the portable electronic device, and a controller. The controller reads the expected voltage value from the lookup table, compares the expected voltage value with the digital voltage value, and determines whether the battery is authorized for use in the portable electronic device according to the expected voltage value and the digital voltage value.

18 Claims, 5 Drawing Sheets

VERIFICATION SYSTEM FOR VERIFYING AUTHENTICITY OF A BATTERY AND METHOD THEREOF

BACKGROUND OF INVENTION

1. Field of the Invention

The present invention relates to a battery of a portable electronic device, and more specifically, to a verification system used for verifying authenticity of a battery used in a portable electronic device.

2. Description of the Prior Art

With the increase of portable electronic devices, batteries used to power the electronic devices have become more important. While some electronic devices use standard batteries such as AA, AAA, C, D, or 9-Volt batteries, other electronic devices make use of proprietary batteries. A common example of a portable electronic device that uses a proprietary battery is a mobile phone. Many mobile phone manufactures design their phones to operate with a proprietary battery that may have a unique size and pin layout. The manufactures of the mobile phones can then generate additional revenue from the sale of backup or replacement batteries bought for each mobile phone.

Unfortunately, the high price of proprietary batteries has created a demand for pirated batteries, and more and more batteries sold today are pirated batteries. Although pirated batteries offer a cheaper alternative to proprietary batteries, problems may arise from their use. For example, a mobile phone using a pirated battery may suffer from decreased performance, and safety becomes a bigger concern. In addition to these problems, the sale of pirated batteries also decreases the revenue of mobile phone manufactures. To combat the sale of pirated batteries, many mobile phone manufactures use piracy protection schemes in their batteries. Although the above example used mobile phones to explain the problem of battery piracy, battery piracy can potentially affect any type of portable electronic device.

Please refer to FIG. 1. FIG. 1 is a diagram of a first verification system 10 according to the prior art. In order to verify the authenticity of a battery 12, the first verification system 10 involves forming a resistor R on the battery 12 that is used in a portable electronic device 14. When the battery 12 is placed in the portable electronic device 14, the portable electronic device 14 flows a test current $I_{test}$ through the resistor R and measures a resulting voltage $V_{test}$ across the resistor R. The test current $I_{test}$ is usually produced by a fixed current source for producing a more precise resulting voltage $V_{test}$. If the value of the resulting voltage $V_{test}$ conforms to a predetermined voltage range in the portable electronic device 14, the battery 12 is authorized for use in the portable electronic device 14. Although the first verification system 10 is simple and inexpensive to manufacture, it is also very easy to pirate. In this case, only the single resistor R is used as an ID of the battery 12. The first verification system 10 offers little protection to battery piracy, and better protection schemes are therefore needed.

Please refer to FIG. 2. FIG. 2 is a diagram of a second verification system 20 according to the prior art. In order to verify the authenticity of a battery 22, the second verification system 20 involves serially transmitting an ID 24 of the battery 22 to a portable electronic device 30 through a single wire 28. The battery 22 contains a first controller 26 for reading the ID 24 from the battery 22 and serially transmitting the ID 24 to a second controller 32 of the portable electronic device 30. Because the first controller 26 is connected to the second controller 32 through the single wire 28, handshaking is required to establish communication between the first controller 26 and the second controller 32. Unfortunately, the handshaking mechanism used in the second verification system 20 requires using active components (the first controller 26 and the second controller 32) on both the battery 22 and the portable electronic device 30. Not only does this complicate the design of the battery 22 and the portable electronic device 30, but it also increases the manufacturing cost as well. Moreover, for all of the complexity that the second verification system 20 contains, the security lies only in the ID 24 stored in the battery 22. If this ID 24 is discovered, the battery 22 can then be pirated quite easily.

SUMMARY OF INVENTION

It is therefore a primary objective of the claimed invention to provide a verification system for verifying authenticity of a battery used in a portable electronic device in order to solve the above-mentioned problems.

According to the claimed invention, a verification system for verifying authenticity of a battery used in a portable electronic device includes a battery for supplying a first electrical current, the battery containing a transducer for inducing an analog voltage based on the first electrical current, and a portable electronic device having the battery removably installed therein. The portable electronic device includes an analog-to-digital converter (ADC) electrically connected to the transducer for converting the analog voltage to a digital voltage value, a lookup table for providing an expected voltage value based on an operating state of the portable electronic device, and a controller. The controller reads the expected voltage value from the lookup table based on the operating status of the portable electronic device, compares the expected voltage value with the digital voltage value provided by the ADC, and determines whether the battery is authorized for use in the portable electronic device according to the expected voltage value and the digital voltage value.

It is an advantage of the claimed invention that the verification system verifies the authenticity of the battery by comparing the expected voltage value from the lookup table with the digital voltage value from the ADC. The transducer contains a unique relationship between the inputted first electrical current and the outputted analog voltage, and the lookup table has an approximately conformal relationship stored in the lookup table, which makes the battery more difficult to pirate. Furthermore, the battery contains no active components, reducing the complexity and the cost of the verification system.

These and other objectives of the claimed invention will no doubt become obvious to those of ordinary skill in the art after reading the following detailed description of the preferred embodiment, which is illustrated in the various figures and drawings.

BRIEF DESCRIPTION OF DRAWINGS

FIG. 2 is a diagram of a second verification system according to the prior an.

DETAILED DESCRIPTION

Figure 1:
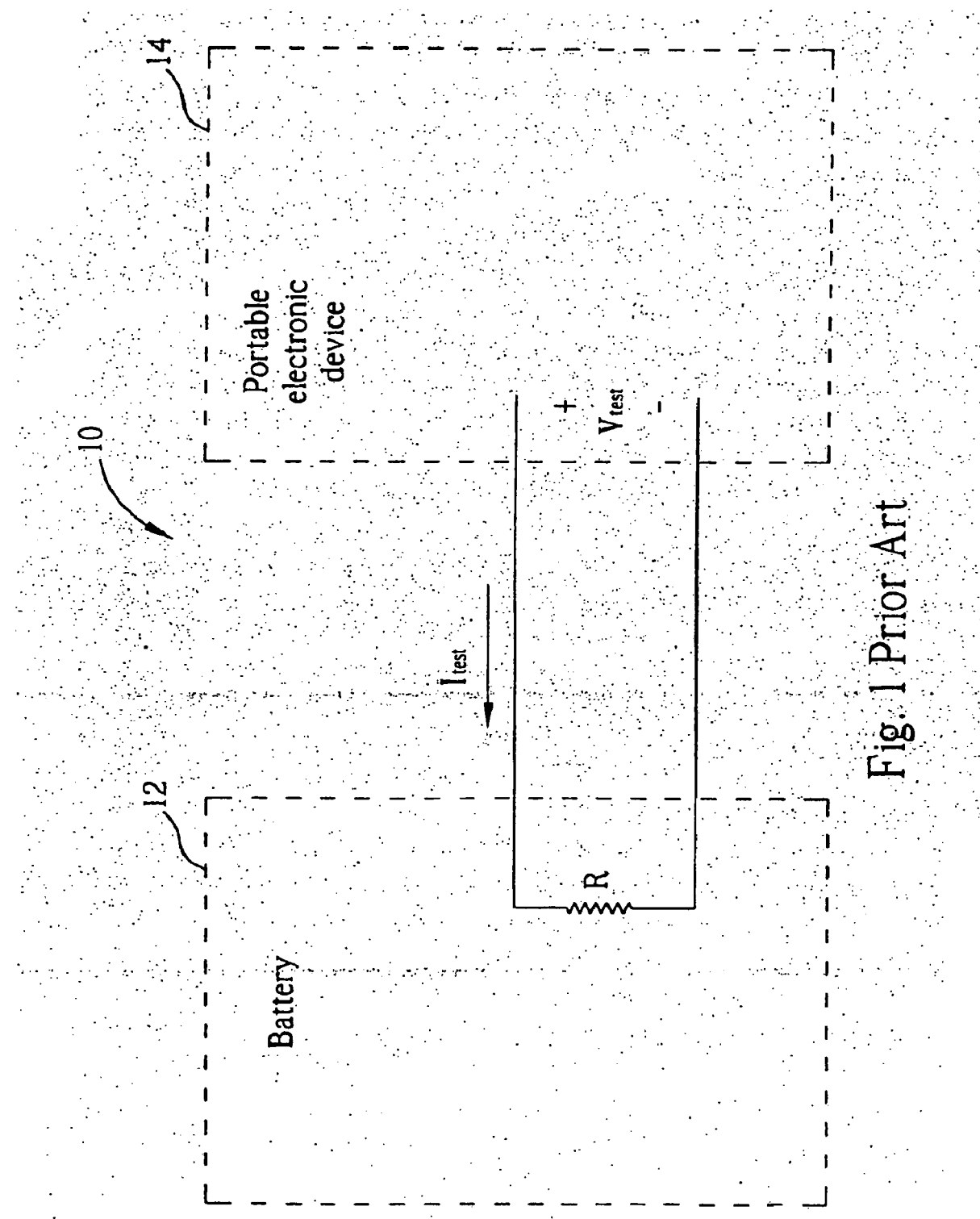
FIG. 1 is a diagram of a first verification system according to the prior art.
Figure 2:
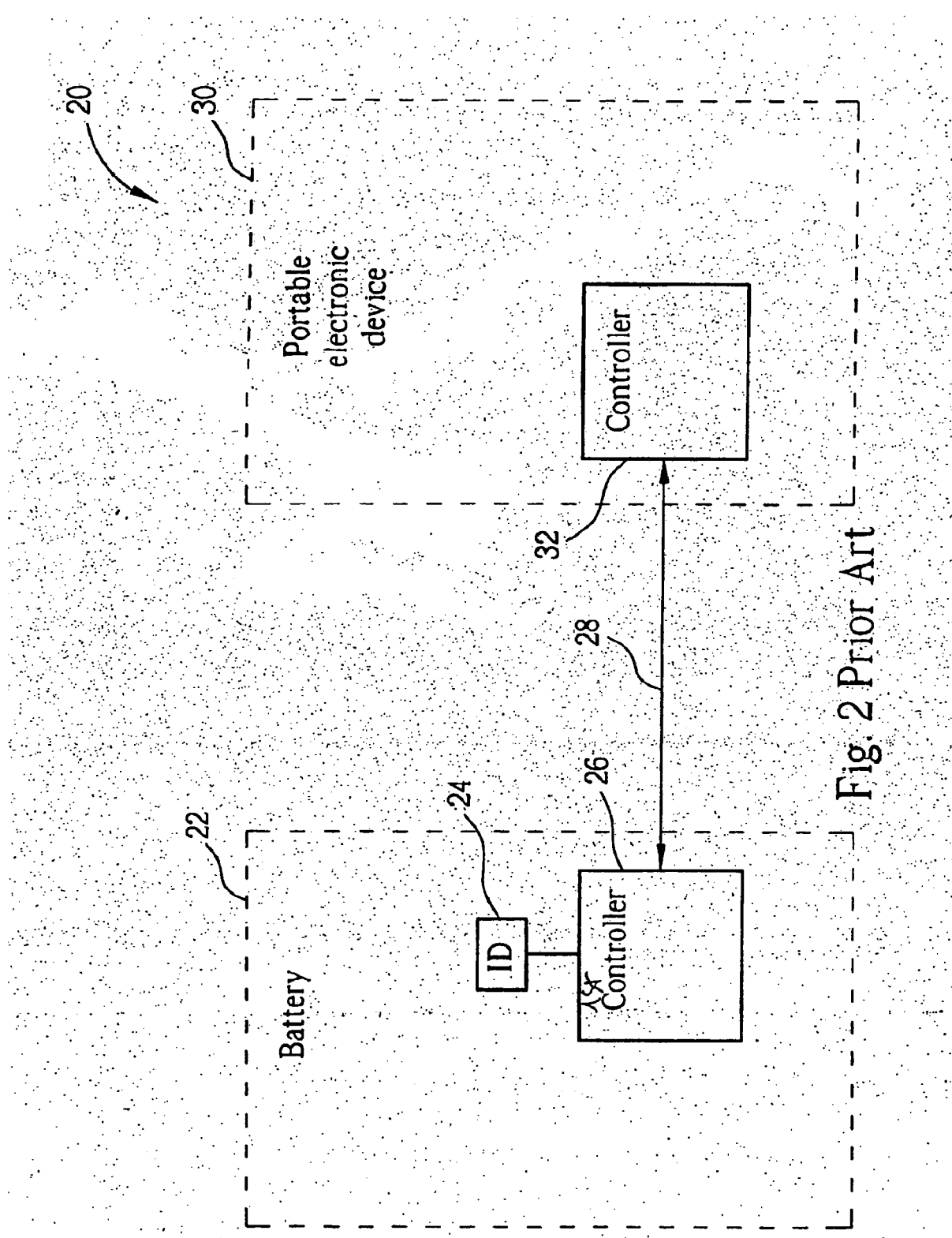
Figure 3:
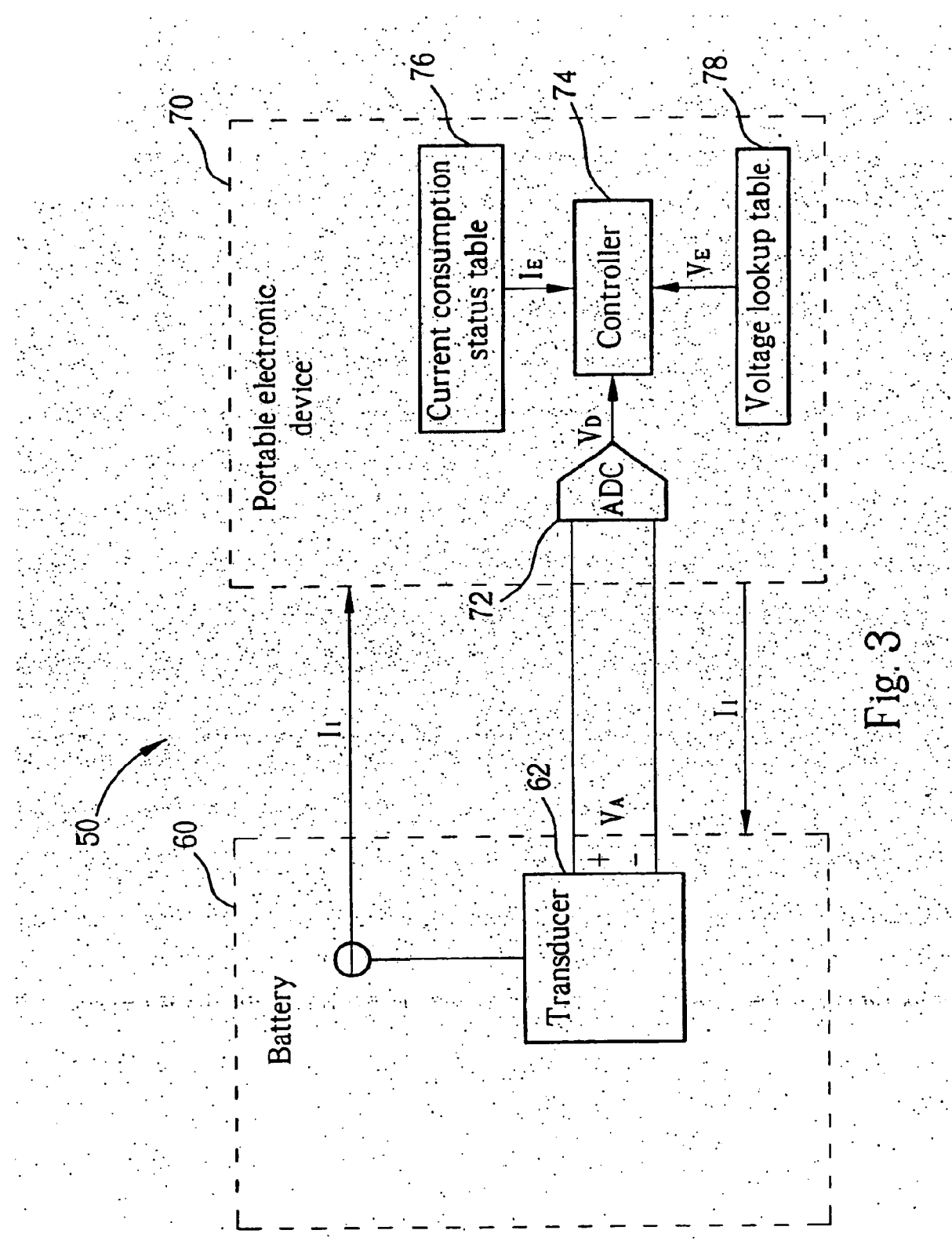
FIG. 3 is a diagram of a verification system according to the present invention.

Please refer to FIG. 3. FIG. 3 is a diagram of a verification system 50 according to the present invention. The verification system 50 provides a simple, cost effective way for a portable electronic device 70 to detect the authenticity of a battery 60. The battery 60 utilizes a non-linear transducer 62 to provide an ID of the battery 60, and the ID can be checked at any time during the operation of the portable electronic device 70.

When the portable electronic device 70 is operating, the battery 60 provides a first electrical current $I_1$ to the portable electronic device 70. The transducer 62 reads this first electrical current $I_1$ and induces an analog voltage $V_A$ based on the first electrical current $I_1$. The portable electronic device 70 comprises an analog-to-digital converter (ADC) 72 electrically connected to the transducer 62 for reading the analog voltage $V_A$ and converting the analog voltage $V_A$ to a digital voltage value $V_D$. The ADC 72 can be connected to the transducer 62 through two pins, with one of the pins being a common ground between the battery 60 and the portable electronic device 70. The converted digital voltage value $V_D$ is then sent to a controller 74, which is used for controlling operations of the portable electronic device 70. The first electrical current $I_1$ used by the portable electronic device 70 will vary depending on what operating state the portable electronic device 70 is in. For example, if the portable electronic device 70 is a mobile phone, the current used by the mobile phone will vary according to the backlight status, transceiver status, acoustic status, etc. As the first electrical current $I_1$ varies, the analog voltage $V_A$ and the digital voltage value $V_D$ will also vary according to the characteristics of the transducer 62.

Because the controller 74 controls operation of the portable electronic device 70, the controller 74 is capable of determining what operating state the portable electronic device 70 is in. The controller 74 then searches a current consumption status table 76 for an expected current value $I_E$ based on the operating state of the portable electronic device 70. After obtaining the expected current value $I_E$, the controller 74 then searches a voltage lookup table 78 for an expected voltage value $V_E$ based on the expected current value $I_E$. The controller 74 compares the expected voltage value $V_E$ to the digital voltage value $V_D$. If a difference between the expected voltage value $V_E$ and the digital voltage value $V_D$ is less than a tolerance value, the battery 60 is then authorized for use in the portable electronic device 70.

Figure 4:
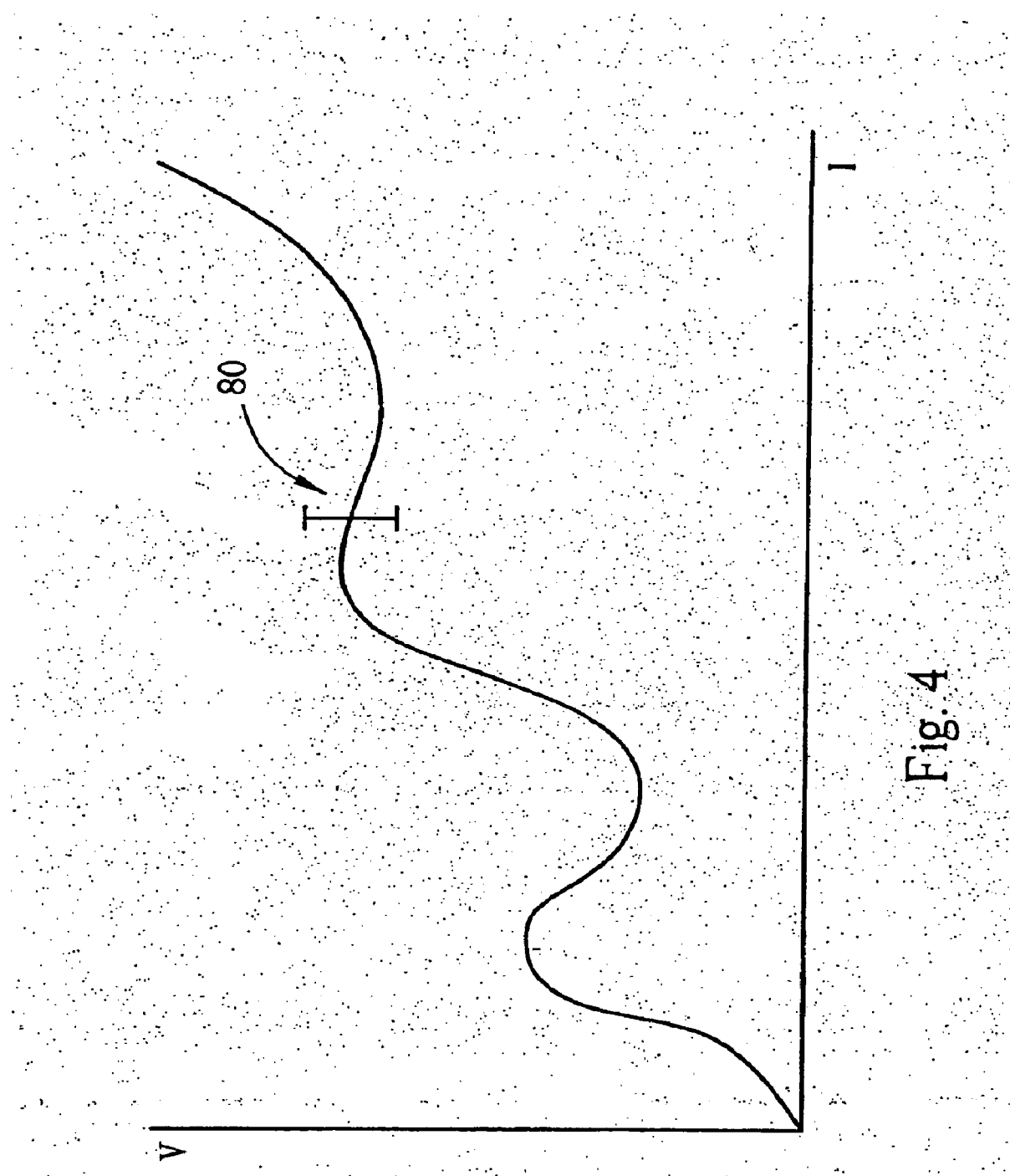
FIG. 4 is a graph showing an analog nonlinear I-V characteristic of the transducer according to the present invention.

Please refer to FIG. 4. FIG. 4 is a graph showing an analog nonlinear I-V characteristic of the transducer 62 according to the present invention. To make the battery 60 more difficult to pirate, the nonlinear I-V characteristic is used instead of a linear relationship between the first electrical current $I_1$ and the analog voltage $V_A$.

The current consumption status table 76 includes current values corresponding to every possible state of the portable electronic device 70. The voltage lookup table 78 contains a discrete version of the analog nonlinear I-V characteristic of the transducer 62. That is, for each possible expected current value $I_E$, the expected voltage value $V_E$ stored in the voltage lookup table 78 is the corresponding voltage value of the I-V characteristic of the transducer 62. As shown in FIG. 4, a tolerance range 80 is shown for showing an authorized range of voltages. If the digital voltage value $V_D$ provided by the ADC 72 is within the tolerance range 80 of the voltage lookup table 78, the battery 60 is then authorized for use in the portable electronic device 70.

Figure 5:
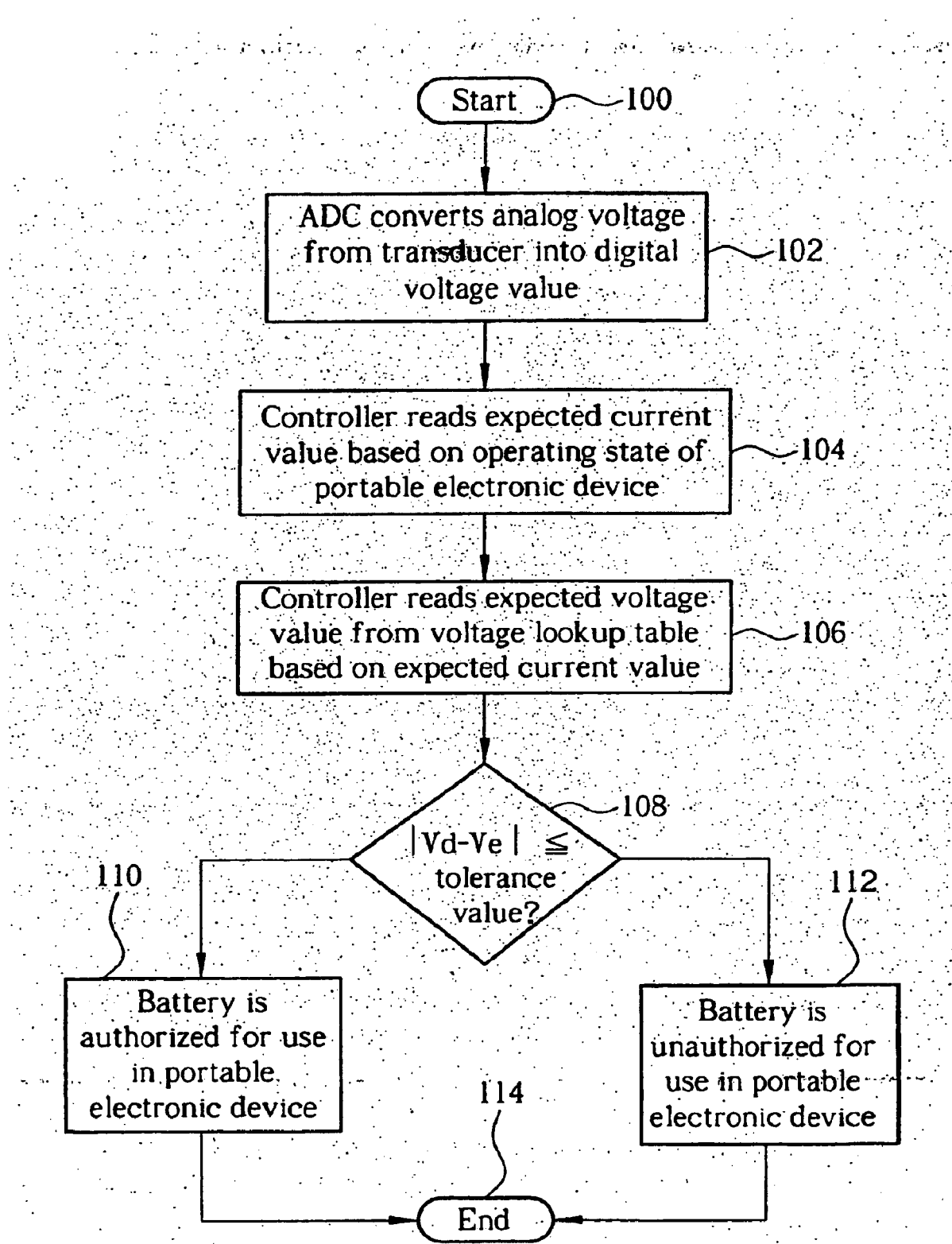
FIG. 5 is a flowchart illustrating verifying the authenticity of the battery according to the present invention method.

Please refer to FIG. 5. FIG. 5 is a flowchart illustrating verifying the authenticity of the battery 60 according to the present invention method. Steps contained in the flowchart will be explained below.

Step 100: Start;
Step 102: The ADC 72 converts the analog voltage VA induced by the transducer 62 into the digital voltage value $V_D$ and sends the digital voltage value $V_D$ to the controller 74;
Step 104: The controller 74 reads the expected current value $I_E$ from the current consumption status table 76 based on the operating state of the portable electronic device 70;
Step 106: The controller 74 reads the expected voltage value $V_E$ from the voltage lookup table 78 based on the expected current value $I_E$;
Step 108: The controller 74 determines if the digital voltage value $V_D$ provided by the ADC 72 is within the tolerance range 80 of the expected voltage value $V_E$ listed in the voltage lookup table 78 (alternatively, the controller 74 can determine if the difference between the digital voltage value $V_D$ and the expected voltage value $V_E$ is less than a predetermined tolerance value); if so, go to step 110; if not, go to step 112;
Step 110: The battery 60 is authorized for use in the portable electronic device 70; go to step 114;
Step 112: The battery 60 is unauthorized for use in the portable electronic device 70; and
Step 114: End.

In summary, the transducer 62 is used as the ID module of the battery 60. Discrete I-V value pairs corresponding to the nonlinear I-V characteristic of the transducer 62 are stored in the voltage lookup table 78. The current consumption status table 76 and the voltage lookup table 78 are stored in a nonvolatile memory of the portable electronic device 70. The nonvolatile memory is preferably a flash memory, although a read-only memory can also be used. The controller 74 then compares voltage values produced by the transducer 62 with voltage values stored in the voltage lookup table 78 for verifying the authenticity of the battery 60. Each battery 60 that is authorized for use in the portable electronic device 70 would be equipped with the transducer 62 having the same characteristics. Any battery that did not contain the correct I-V characteristics would not be authorized for use in the portable electronic device 70. It should be noted that a single lookup table could be used in the present invention instead of using both the current consumption status table 76 and the voltage lookup table 78. The single lookup table could store voltage values based on a state of the portable electronic device 70. Alternatively, the portable electronic device 70 could measure the first electrical current $I_1$ and the single lookup table could provide expected voltages corresponding to various values of the first electrical current $I_1$. Other variations are possible, as long as the voltage produced by the transducer 62 is compared to the voltage stored in the lookup table for verifying the authenticity of the battery 60.

Compared to the prior art verification systems 10 and 20, the verification system 50 of the present invention uses the nonlinear transducer 62 to identify the battery 60. The transducer 62 is more difficult to pirate than other protection mechanisms due to its unique nonlinear I-V characteristics. Moreover, the transducer 62 is a passive component, meaning the battery 60 does not need a controller to communicate with the portable electronic device 70. Only the common ADC 72 is required for sending data from the battery 60 to the portable electronic device 70. The cost of the present invention verification system 50 depends largely on the cost of the transducer 62. The transducer 62 can be built using couples of transistors with predetermined characteristics. If the transducer 62 is mass produced, the price can become very reasonable, making the present invention verification system 50 an easy and inexpensive protection against piracy.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A verification system for verifying authenticity of a battery used in a portable electronic device, the system comprising:
   a battery for supplying a first electrical current, the battery comprising a transducer for inducing an analog voltage based on the fist electrical current; and
   a portable electronic device having the battery removably installed therein, the portable electronic device comprising:
      an analog-to-digital converter (ADC) electrically connected to the transducer for converting the analog voltage to a digital voltage value;
      a lookup table for providing an expected voltage value based on an operating state of the portable electronic device; and
      a controller for reading the expected voltage value from the lookup table based on the operating status of the portable electronic device, comparing the expected voltage value with the digital voltage value provided by the ADC, and determining whether the battery is authorized for use in the portable electronic device according to the expected voltage value and the digital voltage value.

2. The verification system of claim 1 wherein the lookup table comprises a current consumption status lookup table and a voltage lookup table, the current consumption status lookup table providing an expected current value based on the operating state of the portable electronic device and the voltage lookup table providing the expected voltage value based on the expected current value.

3. The verification system of claim 2 wherein the transducer of the battery is a nonlinear transducer for producing a nonlinear relationship between the inputted first electrical current and the outputted analog voltage.

4. The verification system of claim 3 wherein a relationship between the expected current value and the expected voltage value in the voltage lookup table is conformal to the nonlinear relationship between the inputted first electrical current and the outputted analog voltage in the transducer of the battery.

5. The verification system of claim 1 wherein a relationship between the first electrical current and the expected voltage value is conformal to a nonlinear relationship between the inputted first electrical current and the outputted analog voltage in the transducer of the battery.

6. The verification system of claim 1 wherein if a difference between the digital voltage value provided by the ADC and the expected voltage value is less than a predetermined tolerance value, the controller determines the battery is authorized for use in the portable electronic device.

7. The verification system of claim 1 wherein the lookup table is stored in a nonvolatile memory of the portable electronic device.

8. The verification system of claim 7 wherein the nonvolatile memory is a flash memory.

9. The verification system of claim 7 wherein the nonvolatile memory is a read-only memory.

10. A method of verifying authenticity of a battery used in a portable electronic device, the method comprising:
   providing a transducer for inducing an analog voltage based on a first electrical current provided by the battery;
   converting the analog voltage into a digital voltage value with an analog-to-digital converter (ADC);
   searching a lookup table for an expected voltage value bed on an operating state of the portable electronic device;
   comparing the expected voltage value with the digital voltage value provided by the ADC; and
   determining whether the battery is authorized for use in the portable electronic device according to the expected voltage value and the digital voltage value.

11. The method of claim 10 wherein the lookup table comprises a current consumption status lookup table and a voltage lookup table, and searching the lookup table for an expected voltage value comprises searching the current consumption status lookup table for an expected current value based on the operating state of the portable electronic device and searching the voltage lookup table for the expected voltage value based on the expected current value.

12. The method of claim 11 wherein the transducer is a nonlinear transducer for producing a nonlinear relationship between the inputted first electrical current and the outputted wog voltage.

13. The method of claim 12 wherein a relationship between the expected current value and the expected voltage value in the voltage lookup table is conformal with the nonlinear relationship between the inputted fist electrical current and the outputted analog voltage in the transducer.

14. The method of claim 10 wherein a relationship between the first electrical current and the expected voltage value is conformal to a nonlinear relationship between the inputted first electrical current and the outputted analog voltage in the transducer of the battery.

15. The method of claim 10 wherein if a difference between the digital voltage value provided by the ADC and the expected voltage value is less than a predetermined tolerance value, the batter is authorized for use in the portable electronic device.

16. The method of claim 10 wherein the lookup table is stored in a nonvolatile memory of the portable electronic device.

17. The method of claim 16 wherein the nonvolatile mcmory is a flash memory.

18. The method of claim 16 wherein the nonvolatile memory is a read-nly memory.

* * * * *